United States Patent [19]
Kizilyalli et al.

[11] Patent Number: 5,994,221
[45] Date of Patent: Nov. 30, 1999

[54] METHOD OF FABRICATING ALUMINUM-INDIUM (OR THALLIUM) VIAS FOR ULSI METALLIZATION AND INTERCONNECTS

[75] Inventors: Isik C. Kizilyalli; Sailesh M. Merchant, both of Orlando, Fla.

[73] Assignee: Lucent Technologies Inc., Murray Hill, N.J.

[21] Appl. No.: 09/016,475

[22] Filed: Jan. 30, 1998

[51] Int. Cl.[6] .............................. H01L 23/48; H01L 23/54
[52] U.S. Cl. .......................... 438/688; 438/678; 257/750; 257/752
[58] Field of Search ................................... 438/688, 678; 257/750, 752, 307; 428/411.1, 447

[56] References Cited

U.S. PATENT DOCUMENTS

| | | | |
|---|---|---|---|
| 3,281,239 | 10/1966 | Reding et al. | 75/138 |
| 3,413,157 | 11/1968 | Kuiper | 148/1.5 |
| 4,098,606 | 7/1978 | Despic et al. | 75/138 |
| 4,970,176 | 11/1990 | Tracy et al. | |
| 5,518,674 | 5/1996 | Powell et al. | |
| 5,534,463 | 7/1996 | Lee et al. | 437/195 |
| 5,633,199 | 5/1997 | Fiordalice et al. | 438/642 |
| 5,744,865 | 4/1998 | Jeng et al. | |
| 5,789,818 | 8/1998 | Havemann | |
| 5,879,808 | 3/1999 | Wary et al. | |
| 5,888,899 | 3/1999 | Paranjpe | 438/625 |
| 5,904,499 | 5/1999 | Pace | |
| 5,917,707 | 6/1999 | Khandros et al. | |

OTHER PUBLICATIONS

K. Kikuta and T. Kikkawa; A1–Ge Reflow Sputtering for Submicron Contact Hole Filling; J. Electrochem. Soc., vol. 143, No.1, Jan. 1996; pp. 228–232.

G.A. Dixit, M.F. Chisholm, M.K. Jain, T. Weaver, L.M. Ting, S. Poarch, K. Mizobuchi and R. H. Havemann; A Novel High Pressure Low Temperature Aluminum Plug Technology for Sub–0.5$\mu$m Contact/Via Geometries; 1994 IEDM; pp. 105–108.

B. Zhao, M.A. Biberger, V. Hoffman, S.–Q. Wang, P.K. Vasudev and T.E. Seidel; A Novel Low Temperature PVD Planarized A1–Cu Process for High Aspect Ratio Sub–Half Micron Interconnect; IEDM 1996; pp. 353–356.

*Primary Examiner*—Charles Bowers
*Assistant Examiner*—Martin Sulsky

[57] ABSTRACT

The present invention provides a method of forming an alloy interconnect in an integrated circuit having a dielectric layer with an opening formed therein. In an advantageous embodiment, the method comprises the steps of forming a metal alloy within the opening. The metal alloy comprises at least a first and a second metal with the first metal selected from a Group 13 metal and having a melting point substantially lower than a melting point of the second metal and the dielectric. This particular method further comprises the steps of subjecting the first and second metals to a temperature sufficient to melt the first metal and reflow the metal alloy.

6 Claims, 3 Drawing Sheets

METHOD OF FABRICATING ALUMINUM-INDIUM (OR THALLIUM) VIAS FOR ULSI METALLIZATION AND INTERCONNECTS

TECHNICAL FIELD OF THE INVENTION

The present invention is directed, in general, to a method of forming a plug and interconnect formed in an integrated circuit, and, more specifically, forming a plug and interconnect from aluminum and a Group 13 metal having a low melting point.

BACKGROUND OF THE INVENTION

Integrated circuits in general, and CMOS devices in particular, have continued to gain wide spread usage as demands for increased functionality and enhanced benefits continue to increase. In order to meet this demand, the integrated circuit industry continues to develop new circuit structures that enhance capabilities and extend the use of existing fabrication processes and equipment.

Key to the fabrication of integrated circuits is the ability to construct highly reliable and low resistance connections between the individual semiconductor device terminals themselves and other needed circuit components including various power supplying and common signal carrying conductor structures (buses). The industry often refers to connections made directly to a semiconductor device terminal as a contact (or windows) and connections made between other conductor structures as vias. The use of both tungsten and aluminum are well established in the art for use in this capacity.

The standard practice in the industry is to use tungsten plugs for contact (or window) and via-fill processes and Al-alloys (Al—Si, Al—Cu, Al—Cu—Si) for interconnect materials. Unfortunately, as contact and via dimensions decrease, their contact resistance to underlying material increases, especially with W-plugs (see Dixit et al., IEDM 1994). Consequently, two all-Al solutions have been advanced in the literature, (instead of w-plug/Al interconnect structure), that allow significant reductions in contact or via resistance over that obtained with W-plugs. The first solution is a force-fill method (Dixit et al., loc cit) and the second solution is a two-step Al reflow process (Zhao et al., IEDM 1996). However, process temperatures of approximately 450° C. are required during the two-step reflow process for the aluminum to flow, form and adhere properly.

Current technology is expanding to the use of new dielectric materials that have a lower dielectric constant, such as polymer-based aerogels. Unfortunately, however, these polymer-based materials are easily damaged by the high processing temperatures (e.g., approximately 450° C.) normally associated with the reflow processing of aluminum. Accordingly, these materials necessitate the use of lower process fabrication temperatures than are normally used with silicon-based dielectrics. Typically, process temperatures must not exceed a maximum of 350° C. to avoid damaging these new dielectric materials. In an effort to lower the deposition temperatures typically associated with aluminum, some investigators have alloyed aluminum with germanium such as those disclosed in K. Kikuta and T. Kikkawa; J. Electrochem. Society; Vol. 143, No. 1, p. 228–232; January 1996. In such processes, the aluminum-germanium alloy is deposited in the contact opening or via. As is well known, pure aluminum melts at approximately 660° C. Alloys of aluminum and germanium however, lower the melting point drastically. Unfortunately, germanium does not wet the dielectric material well and therefore requires a wetting layer of polysilicon to form and flow properly. Another problem with using a germanium-aluminum alloy is that the germanium precipitates epitaxially on silicon during subsequent processing since the crystal structures of the two are very similar. These problems have prevented wide spread commercial application of the aluminum-germanium alloy.

In summary, the use of aluminum to form contact and via interconnect structures has often resulted in unacceptably high contact resistance, alloy processing temperatures that are too high, particularly for polymer-based dielectrics, or other alloy characteristics that prevent successful commercial application.

Accordingly, what is needed in the art is an alloy forming interconnect process that operates successfully at temperatures low enough to prevent damage to desired polymer dielectrics.

SUMMARY OF THE INVENTION

To address the above-discussed deficiencies of the prior art, the present invention provides a method of forming an alloy interconnect in an integrated circuit having a dielectric layer with an opening formed therein. In an advantageous embodiment, the method comprises the steps of forming a metal alloy within the opening. The metal alloy comprises at least a first and a second metal with the first metal selected from a Group 13 metal and having a melting point substantially lower than a melting point of the second metal and a glass transition temperature Tg of the dielectric. This particular method further comprises the steps of subjecting the first and second metals to a temperature sufficient to melt the first metal and reflow the metal alloy.

In another aspect of the present invention, the method further includes the steps of forming a layer of the first metal within the opening, forming a layer of the second metal on the first metal within the opening, and then subjecting the first and second metals to a temperature sufficient to melt the first metal and diffuse the first metal into the second metal to form an insitu metal alloy interconnect within the opening. In another aspect of this particular embodiment the method further comprises the step of forming a layer of a third metal, which is comprised of same metal as the first metal, on the second metal within the opening. In yet another aspect of this particular embodiment, the steps of forming the layer of a first metal and the layer of a second metal include the steps of forming alternating layers of the first and the second metals within the opening.

In yet another embodiment of the present invention, the step of forming the metal alloy includes the step of forming the metal alloy with indium metal and aluminum metal.

In another embodiment, the step of subjecting includes the step of subjecting the first and second metals to a temperature of less than about 350° C. and thereby melt the first metal.

In yet another aspect of the present invention, there is provided an interconnect located in an integrated circuit made from the process comprising the steps of forming a metal alloy within an opening in dielectric of the integrated circuit. The metal alloy comprises at least a first and a second metal wherein the first metal is selected from a Group 13 metal and has a melting point substantially lower than a melting point of the second metal and a glass transition temperature of the dielectric and subjecting the first and second metals to a temperature sufficient to melt the first metal and reflow the metal alloy.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
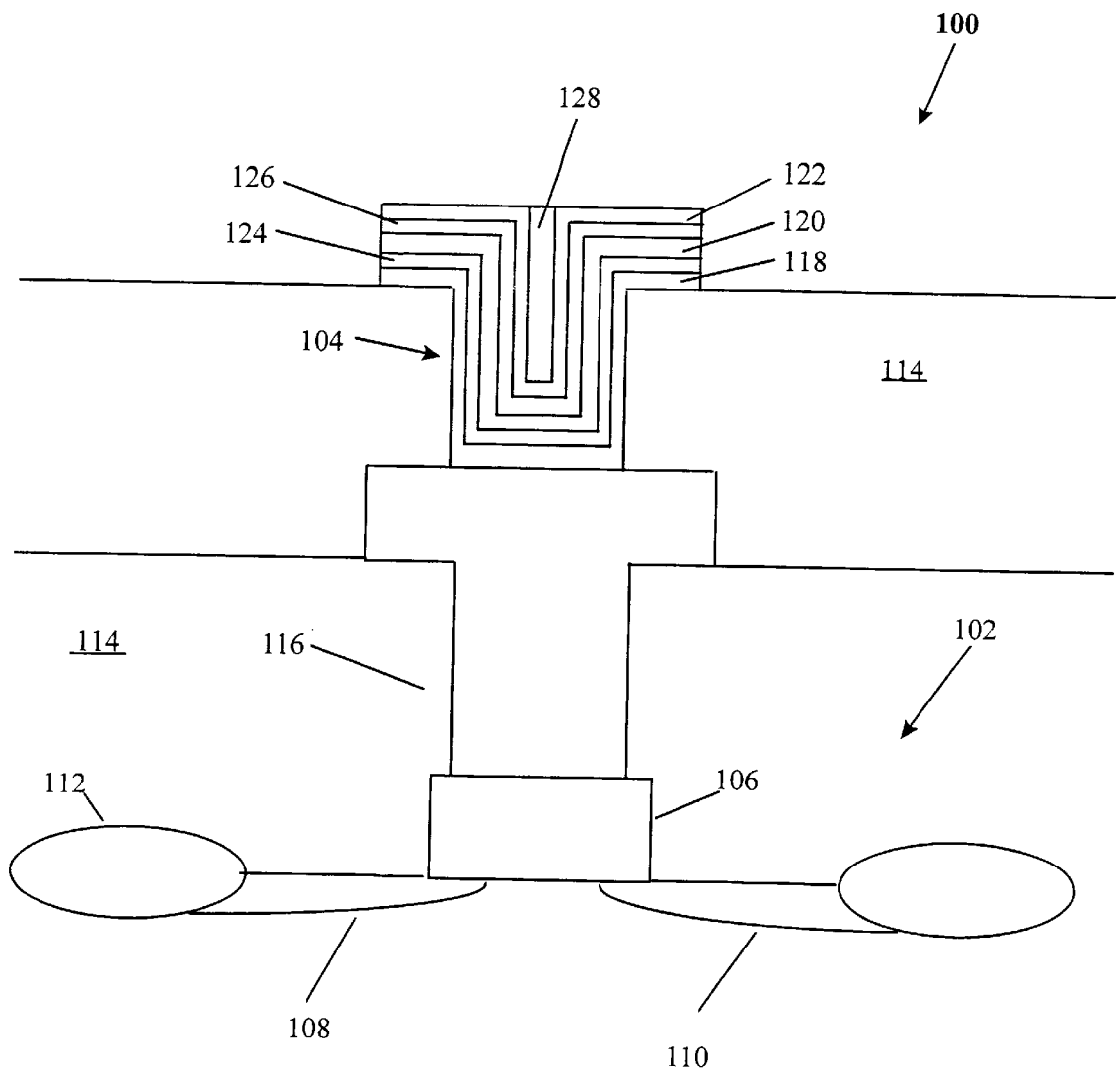
FIG. 1 illustrates a cross-sectional view of one embodiment of a multiple layer contact structure.

Referring initially to FIG. 1, illustrated is a cross-sectional view of one embodiment of an integrated circuit structure 100, showing a transistor structure 102 and an interconnect 104 comprising a multiple layer contact structure covered by the present invention. The transistor structure 102 is of conventional design, and one that may be typically found in conventional CMOS devices. The transistor structure 102 may generally include a gate 106, source and drain regions 108,110, respectively and field oxide regions 112, only one of which is illustrated. The transistor structure 102 is electrically isolated from upper layers of the integrated circuit 100 by a dielectric layer 114, such as silicon dioxide. However, it should be noted that the dielectric layer 114 may also be a polymer based dielectric having a low dielectric constant, such as an aerogel, which has a melting point substantially below the melting point of the aluminum.

In some polymer based dielectrics that are used in today's integrated circuit technologies, the glass transition temperatures are typically around 300° C. to 350° C. Aluminum and similar metals, as those mentioned herein, have melting points well above those temperatures. For example, aluminum has a melting point of around 660° C. Unless the melting points of these metals are lowered to a temperature below that of the dielectric, their use is limited to dielectrics having glass transition temperatures (Tg) greater than that of these metals. In one particular embodiment, the present invention provides an alloy metal of indium/aluminum that may be used to form interconnects between the various levels of the integrated circuit 100. The addition of the indium lowers the melting point of aluminum. This alloy combination, when subjected to a rapid thermal anneal processes, enhances surface mobility of the alloy to fill the via above the melting point of the indium but well below the melting point of dielectrics, such as polyer based dielectrics. As explained below in more detail, the alloy may be deposited or formed insitu within the via. The transistor structure 102 is typically connected to other portions of the integrated circuit 100 by a conventional first level metallization/interconnect 116. While discussion of an advantageous embodiment of the present invention is directed to the second metal level and higher, it should be specifically understood, however, that the present invention may be applicable to any level of metal within the integrated circuit, including the first metal level in which the first level metallization/interconnect 116 is located.

In an advantageous embodiment of the present invention, the alloyed interconnect 104 is initially formed of alternate layers of metals that are alloyed insitu versus depositing the alloy into the contact or via opening as occurs in some prior art devices and methods. In this embodiment, layers 118, 120 and 122 are formed using a first metal, and layers 124, 126 and 128 are formed using a second metal. The initial deposition of these alternate layers may be accomplished by physical vapor deposition at a power ranging from about 1 to about 12 kilowatts. These metals are selected to exhibit certain beneficial characteristics throughout the entire process of forming a contact structure. For example, the layers of the first metal 118, 120 and 122 may be a Group 13 metal with layers of the second metal 124, 126, and 128 being aluminum. The Group 13 reference is, of course, referencing the elements as designated in the new International Union of Pure and Applied Chemistry in Periodic Table convention format. In a particularly advantageous embodiment, the Group 13 metal, of which the first metal layer is comprised, is indium. However, other Group 13 metals, such as, thallium may also be used.

In the present invention at least one of the metals has a melting point that is below the glass transition temperature (Tg) of the dielectric such that it would not damage the dielectric. In addition, at least one of these metals has the ability to form an alloy between the metals while insitu within the via. Additionally, it is particularly advantageous if one of these metals has the capability of "wetting" the dielectric, which would also be efficient in forming the contact structure. Group 13 metals, and particularly indium, is believed to exhibit these desirable characteristics. Indium, which has a melting point of 156° C. displays excellent wetting characteristics that may have particular application in the present invention. As mentioned earlier, aluminum is widely used and may be selected as one of the other metals of the alloy. The indium/aluminum alloy combination is believed to provide an advantageous combination. Indium substantially reduces the melting point of aluminum when it is combined with the aluminum. As explained below, the indium may be alloyed with the aluminum to form a target material for a physical vapor deposition. Alternatively, it may be alloyed with the aluminum insitu within the contact opening or via.

In one particular method, the metals are deposited in alternate layers over one another. For example, an indium layer may first be deposited followed by the deposition of an aluminum layer over the indium layer. The manner of deposition may be by conventional processes, such as physical vapor deposition or chemical vapor deposition. However, physical vapor deposition is particularly useful in the present invention.

Figure 2:
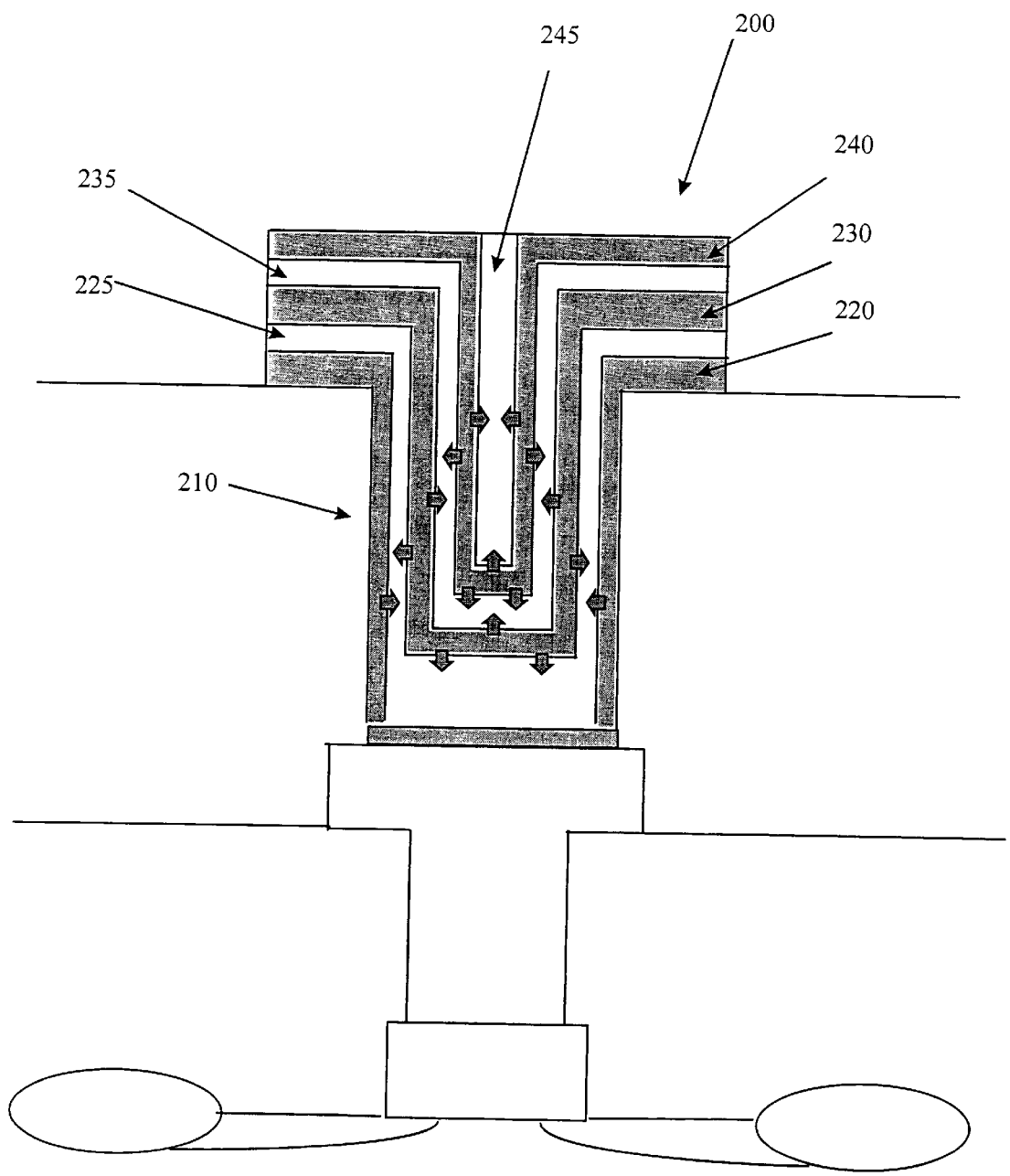
FIG. 2 illustrates a cross-sectional view of one embodiment of alternate layers of the contact structure diffusing into intermediate layers.

Following the deposition of the indium layer, an aluminum layer is then deposited within the via over the indium layer. The manner of deposition may be by conventional processes, such as physical vapor deposition or chemical vapor deposition. However, physical vapor deposition is particularly useful in the present invention. Advantageous conditions at which the aluminum may be deposited is as follows: deposition temperature may range from about 25° C. to about 300° C., at a pressure ranging from about 0.4 milliTorr to about 4 milliTorr. This deposition sequence of indium/aluminum is repeated until the desired amount of material is deposited in the via. The deposition sequence may also vary. For example, there may be just two alternative layers, one of indium and one of aluminum or there may be three layers, indium/aluminum/indium. Of course, as seen from the foregoing examples, additional alternating layers of these metals may be deposited. Following deposition of the desired number of alternating layers, the integrated circuit 100 may be placed into a rapid thermal anneal, wherein the integrated circuit 100 is then heated to around 250° C., which causes the indium layers on either side of the aluminum metal to melt and diffuse into the aluminum layers as illustrated in FIG. 2. Some in-situ melting of the Indium layers may also occur during the Al deposition sequence.

Alternatively, the metal alloy may be deposited as an alloy within the opening and then subjected to a temperature sufficient to reflow the metal in the opening. Due to the presence of the metal that substantially lowers the melting point of the other metal, the reflow temperature may be maintained at a temperature such that it does not damage the dielectric in those applications where the dielectric has a low glass transition temperature (Tg), for example, of around 350° C. or lower.

Turning now to FIG. 2, which is a further illustration of an advantageous embodiment, there is shown an enlarged cross-sectional view of the contact structure 200 having alternate layers of the two different metals indium 220, 230, 240 and aluminum 225, 235, 245. As previously discussed, the temperature is increased to around 250° C., thereby causing the indium layers to melt at approximately 156° C. Of course, it will be appreciated that the degree to which the integrated circuit 100 is heated depends on the metal that is used. At least one of the metals, however, should have a melting point that is substantially less than the melting point of the dielectric. As indicated by the arrows in FIG. 2, the melted indium layers 220, 230, 240 diffuses into the neighboring aluminum layers 225, 235, 245 forming and insitu aluminum-indium alloy. Since indium possess good wetting characteristics, the contact flows, forms and adheres properly. The integrated circuit temperature may be increased above 156° C. to even 250° C. for this embodiment and still provide a satisfactory thermal margin below the decomposition temperature for next generation dielectrics.

Figure 3:
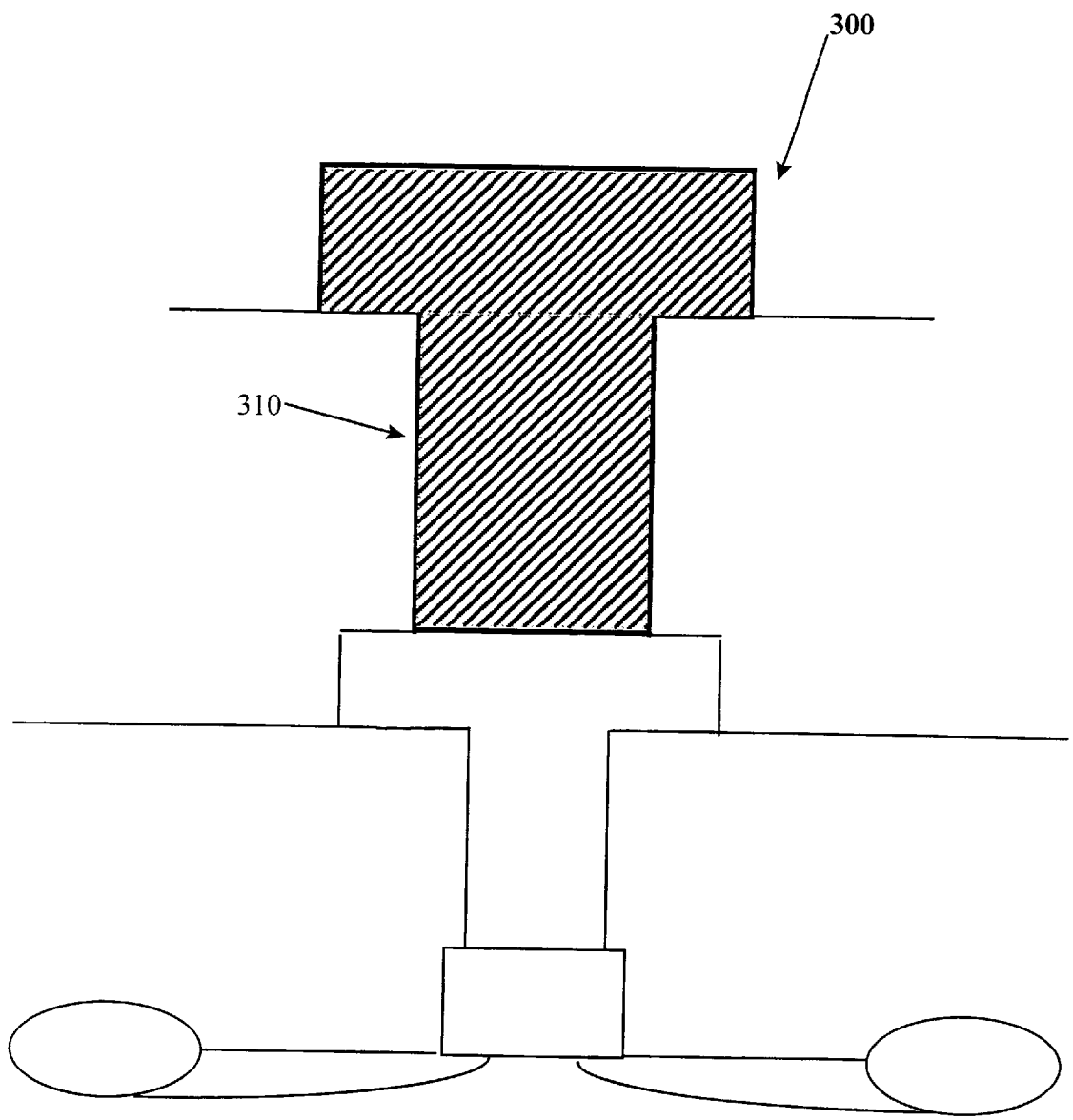
FIG. 3 illustrates a cross-sectional view of one embodiment of a formed metal alloy interconnect covered by the present invention.

Turning now to FIG. 3, illustrated is an enlarged cross-sectional view of the contact structure 300 showing an embodiment of the metal alloy interconnect 310 after it has been reflowed or formed insitu within the opening. In those instances where the metal alloy is formed insitu, the metal having the lower melting point diffuses into the metal having the higher melting point while at the same time reflowing the metal having the higher melting point and wetting the sides of the contact opening such that the metal alloy uniformly fills the contact opening or via. After the formation of the metal alloy within the opening subsequent process steps are conducted to pattern and etch the interconnect.

From the foregoing it can be seen that the present invention provides a method of forming an alloy interconnect in an integrated circuit having a dielectric layer with an opening formed therein. In an advantageous embodiment, the method comprises the steps of forming a metal alloy within the opening. The metal alloy comprises at least a first and a second metal with the first metal selected from a Group 13 metal and having a melting point substantially lower than a melting point of the second metal and the dielectric. This particular method further comprises the steps of subjecting the first and second metals to a temperature sufficient to melt the first metal and reflow the metal alloy.

Although the present invention has been described in detail, those skilled in the art should understand that they can make various changes, substitutions and alterations herein without departing from the spirit and scope of the invention in its broadest form.

What is claimed is:

1. A method of forming an alloy interconnect in an integrated circuit having a polymer based dielectric layer with an opening formed therein, comprising:

forming a metal alloy within said opening, by forming a first metal layer and forming a second metal layer on said first metal layer, said first metal comprised of a metal selected from a Group 13 metal and having a melting point lower than a melting point of a metal comprising said second metal layer and lower than a glass transition temperature (Tg) of said polymer based dielectric; and subjecting said first and second metal layers to a temperature less than temperature of about said glass transition temperature, but sufficient to melt and reflow said first metal to thereby form said metal alloy.

2. The method as recited in claim 1 wherein the method of forming said alloy further includes:

forming a layer of said first metal within said opening;

forming a layer of said second metal on said first metal within said opening; and subjecting said first and second metals to a temperature less than about 350° C., but sufficient to melt said first metal and diffuse said first metal into said second metal to form an insitu metal alloy plug and interconnect within said opening.

3. The method as recited in claim 1 further comprising forming a third metal layer on said second metal layer, said third metal layer comprised of a same metal comprising said first metal layer.

4. The method as recited in claim 1 wherein forming said first metal layer and said second metal layer include forming alternating layers of said first and said second layers.

5. The method as recited in claim 1 wherein forming said first metal layer includes forming said first metal layer with indium and forming said second metal layer includes forming said second metal layer with aluminum.

6. The method as recited in claim 1 wherein said first metal layer comprises thallium.

* * * * *